US006832182B1

(12) United States Patent
Wilson, Jr.

(10) Patent No.: US 6,832,182 B1
(45) Date of Patent: Dec. 14, 2004

(54) CIRCUIT SIMULATOR

(75) Inventor: Thomas G. Wilson, Jr., Eden Prairie, MN (US)

(73) Assignee: Transim Technology Corporation, Portland, OR (US)

( * ) Notice: Subject to any disclaimer, the term of this patent is extended or adjusted under 35 U.S.C. 154(b) by 0 days.

(21) Appl. No.: 09/937,960

(22) PCT Filed: Apr. 7, 2000

(86) PCT No.: PCT/US00/09350

§ 371 (c)(1),
(2), (4) Date: Sep. 28, 2001

(87) PCT Pub. No.: WO00/62208

PCT Pub. Date: Oct. 19, 2000

Related U.S. Application Data

(60) Provisional application No. 60/128,381, filed on Apr. 8, 1999.

(51) Int. Cl.[7] .............................................. G06F 17/50

(52) U.S. Cl. .............................. 703/13; 703/19; 716/5

(58) Field of Search ............................. 703/14, 19, 2, 703/13; 702/117; 716/5, 11

(56) References Cited

U.S. PATENT DOCUMENTS

| | | | |
|---|---|---|---|
| 4,306,286 A | 12/1981 | Cocke et al. | 364/200 |
| 4,922,432 A | 5/1990 | Kobayashi et al. | 364/490 |
| 5,278,770 A | 1/1994 | Gore et al. | 364/490 |
| 5,510,998 A | 4/1996 | Woodruff et al. | 364/489 |
| 5,634,003 A | 5/1997 | Saitoh et al. | 395/200.1 |
| 5,666,288 A | 9/1997 | Jones et al. | 364/490 |
| 5,677,846 A | 10/1997 | Kumashiro | 364/488 |
| RE35,671 E | 11/1997 | Hartoog | 364/491 |
| 5,706,206 A | 1/1998 | Hammer et al. | 364/489 |
| 6,152,612 A * | 11/2000 | Liao et al. | 703/23 |

OTHER PUBLICATIONS

Michael and Ismail, "Statistical Modeling of Device Mismatch for Analog Integrated Circuits," IEEE, Feb. 1992.*

Wilson, Thomas G., Jr., "Life After the Schematic: The Impact of Circuit Operation on the Physical Realization of Electronic Power Supplies," *Proceedings of the IEEE*, vol. 76, No. 4, Apr. 1988, pp. 325–334.

Lee, Ellen S., and Wilson, Thomas, G. Jr., "Electrical Design Inspection: A Methodology for Using Circuit Simulation in the Design and Development of Electronic Power Supplies," *IEEE Transactions on Power Electronics*, vol. 8, No. 4, Oct. 1993, pp. 475–485.

Li, Qiong, Waite, Jerry, Hodkiewicz, Roy, Wilson, Thomas G. Jr., and Lee, Fred C., "Multiple Levels of Complexity in Modeling and Simulation Power Supply Subsystems," *Virginia Power Electronics Center, Seminar Proceedings*, Sep. 1997, pp. 241–249.

(List continued on next page.)

*Primary Examiner*—Thai Phan
(74) *Attorney, Agent, or Firm*—Stoel Rives LLP

(57) ABSTRACT

An electronic circuit simulator technique dramatically reduces barriers to simulation of complex analog circuits. The simulator technique reduces simulation preparation time by permitting a skilled user to formulate a simulation strategy that can combine a modeling strategy, a deck extraction strategy, and a comprehensive suite of pre-engineered simulation tests that fully characterize a system under test. The simulation technique reduces the CPU time required for each test by allowing a skilled user to encode a device modeling strategy and a deck extraction strategy that effectively minimize the CPU time required to achieve a given simulation objective. For a given simulation objective, a skilled user chooses for each element implemented in a simulation a device model of minimum complexity that achieves a desired level of simulation accuracy and extracts a portion of the complete production schematic that achieves the desired level of simulation accuracy.

22 Claims, 11 Drawing Sheets

OTHER PUBLICATIONS

Li, Qiong, Lee, Fred C., Wilson, Thomas G. Jr., and Quinn, Conor A., "Using Siumlation for Design Verification of Bias Power Supply and its Interactions in a Multiple–Converter System," *APEC '99 Fourteenth Annual Applied Power Electronics Conference and Exposition. 1999 Conference Proceedings, Proceedings of APEC '99 Applied Power Electronics Conference, Dallas, TX, USA*, Mar. 1999, vol. 1, pp. 184–190.

* cited by examiner

| MODEL LEVEL | DEVICE MODELS BY LEVEL | |
|---|---|---|
| | OUTPUT CAPACITOR | POWER FET |
| I |  |  |
| II |  |  |
| III |  |  |

MENU: TWO TRANSISTOR FORWARD

CLUB: POWER STAGE 152

| | 170 | |
|---|---|---|
| R1 | 10.0 | Ohms |
| R2 | 10.0 | Ohms |
| L1 | 130 n | H |
| L2 | 1.7 μ | H |
| C1C | 11200 μ | F |
| C1R | 0.009 | Ohms |
| C1L | 10n | H |
| C2C | 16800 μ | F |
| C2R | 0.006 | Ohms |
| C2L | 10 n | H |
| T1 Pri Turns | 52 | |
| T1 SecTurns | 2 | |
| T1L leakage | 15 μ | H |
| T1L mag | 0.008 | H |
| T1R pri | 0.010 | Ohms |
| T1R sec | 0.001 | Ohms |

CLUB: CONTROL 154

CLUB: ERROR AMP 156

CLUB: PWM 158

CLUB: GATE DRIVE 162

Fig. 9A

MENU: TWO TRANSISTOR FORWARD

CIRCUIT SPECIFICATIONS

| | | |
|---|---|---|
| v_bulk_nom | 396 | V |
| v_bulk_ntol | 0.757 | multiplier |
| v_bulk_ptol | 1.08 | multiplier |
| i_out_full_load | 90 | A |
| i_out_current_limit_min | 95 | A |
| i_out_current_limit_max | 130 | A |
| i_out_step_load_slew_rate | 1.000000 | A / ms |
| i_out_vset | 45 | A |
| v_out_ptol_total | 1.011 | multiplier |
| v_out_nom | 5.2 | V |
| v_out_ntol_set | 0.999 | multiplier |
| v_out_ptol_set | 1.001 | multiplier |
| v_bias_pri_nom | 17 | V |
| v_bias_sec_nom | 5 | V |

Fig. 9B

CIRCUIT SIMULATOR

RELATED APPLICATIONS

This application is a 371 of PCT/US00/09350, filed Apr. 7, 2000, which claims benefit of U.S. Provisional Patent Application No. 60/128,381, filed Apr. 8, 1999.

TECHNICAL FIELD

This invention relates to circuit simulation and, in particular, to simulation of complex analog circuits, such as production power supplies.

BACKGROUND OF THE INVENTION

This invention solves problems inherent in the simulation process of design verification testing of complex analog circuits, such as those designed and used by the power electronics industry. In many cases, the barriers to using simulation as an integral part of the design process have heretofore been insurmountable. Even for relatively small circuits (e.g., 100 components), the preparation time required to obtain the first usable results exceeded any practical allotment in a product development schedule. A brute-force modeling strategy that entails always using the most complex device model served in the past to reduce preparation time and tended to maximize the central processing unit (CPU) computation time required to carry out an individual simulation.

Moreover, the complexity of a typical production electrical circuit schematic further increased the CPU time required to carry out an individual simulation to the extent that the simulation time often exceeded any practical time budget. Using these strategies to carry out a sufficient number of tests to adequately characterize the performance of a typical circuit design could easily exceed 30 days of CPU time. In some cases, a sufficiently complex complete production schematic, together with the additional mathematical difficulty resulting from a brute-force modeling strategy, made it impracticable to obtain any simulation results whatsoever.

These barriers are exacerbated in the simulation of full production power supplies. Challenges inherent in the simulation of full production power supplies stem from the presence of many energy storage components, which result in a consequent large range of time constants and many energy transfer cycles to reach steady state operation.

If these barriers to simulation can be overcome, the potential economic benefit using simulation to improve the development process in the power electronics industry could be very significant. By simulating the production schematic circuit diagram, a majority of the design errors typically imbedded in a first prototype hardware model can be detected before printed circuit board layout is undertaken. Simulation can result in far fewer design errors becoming embedded initially in the prototype hardware and a consequent reduction in the number of hardware prototype iterations and overall significant reduction in product development cycle time.

GLOSSARY

The following is a set of definitions of terms used throughout the patent application:

A "device" is a specific electrical hardware component, software implementation, or circuit that may be represented by a single element or component. Examples of "devices" include a 5600 $\mu$F, 10 volt, aluminum electrolytic output capacitor; a 1N4148 general small signal PN rectifier; and a snubber circuit that compensates for adverse parasitic inductance in a transformer. A "device" has nodes, often referred to as leads, for connection to nodes of other devices in the system or subsystem. A connection of device nodes is referred to as a "circuit node."

A "device model" is a mathematical representation (which includes either one of or both analytical and numerical models) of the electrical behavior of a specific device when subject to one or more specific electrical conditions. A typical device may have multiple device models of varying complexity representing the behavior of the device for various purposes. The term "device model level" distinguishes different device models of a given device.

A "system" is a complete electrical or electronic system of devices under test. A "system" may be represented by a production schematic diagram illustrating the connection of device nodes to system circuit nodes. For purposes herein, a "system" does not necessarily include sources and loads that are not part of the production circuit.

A "subsystem" is a portion of a system for which the user desires meaningful simulation results.

A "netlist" is a set of statements that define devices and the connection of device nodes to circuit nodes in a system or subsystem.

A "production netlist" is a netlist of the production circuit without simplification for simulation purposes. A production netlist may, for example, be the result of a computer-aided design (CAD) schematic capture program.

An "attribute club" is a collection of devices that exhibit a common attribute, which may be electrical, mechanical, magnetic, or radiant in nature. The members of an "attribute club" normally have a common specified device model level for at least one test-type objective.

A "function club" is a collection of devices that operate together to perform a specified function. Attribute clubs and function clubs are sometimes collectively referred to as "clubs."

A "test-type objective" is a common simulation objective of a test or collection of tests performed on a test-type deck, which is defined below.

A "test-type selection process" is a process applied to a system or subsystem netlist by which a set of function clubs is used to select an appropriate netlist for simulation consistent with a given test-type objective.

A "test-type model selection process" is a process applied to the group of devices resulting from the test-type selection process to select device models at a device model level consistent with a given test-type objective.

A "test-type deck" is the result of a test-type selection process and a test-type model selection process. A "test-type deck" is a description of the interconnections of a collection of devices, together with the device models at a selected model level, formulated to carry out a common test-type objective.

An "external component" refers to any external simulation test component that is added to a test-type deck to enable simulation of the system or subsystem under the desired operating conditions. Examples of external components include energy sources, active and passive loads, and active and passive components that provide excitation input signals such as signals to adjust, enable, or disable certain circuit functions.

A "simulation deck" is the result of combining a test-type deck with the appropriate external components and other instructions for the simulation engine, such as duration of simulation and requests to produce certain specific circuit waveforms. Test-type decks and simulation decks are sometimes referred to in shorthand manner as "decks."

SUMMARY OF THE INVENTION

The present invention dramatically reduces each of these barriers to simulation of complex analog circuits. The invention reduces the preparation time not by using a brute force modeling strategy but by permitting a skilled user to formulate a simulation strategy that can combine a modeling strategy, a deck extraction strategy, and a comprehensive suite of pre-engineered simulation tests that fully characterize a system under test. This pre-engineered simulation strategy can be applied to a new system very quickly in an automated fashion by a circuit designer having much less simulation experience than that of the skilled user who formulated the simulation strategy.

The invention reduces the CPU time required for each test by allowing a skilled user to encode a device modeling strategy and a deck extraction strategy that effectively minimize the CPU time required to achieve a given simulation objective. In other words, for a given simulation objective, a skilled user chooses for each element implemented in a simulation a device model of minimum complexity that achieves a desired level of simulation accuracy and extracts a portion of the complete production schematic that achieves the desired level of simulation accuracy.

The invention reduces dramatically the effort required of a user to compose a required number of inputs to run a specified number of simulation tests and reduces dramatically the amount of CPU time required to run these tests. Coverage of 300–600 tests in fewer than 12 hours is achievable with the present invention, as compared with running one test in 24 hours or 500 tests in more than 30 CPU days, as is currently achievable with conventional techniques. As a result, this invention provides a new simulation capability that dramatically reduces the development interval for complex analog circuits and products implemented with them.

BRIEF DESCRIPTION OF THE DRAWINGS

FIGS. 8, 9A, 9B, and 10 taken together are useful in explaining the use of the invention to simulate a system depicted in the block/circuit diagram of FIG. 8, and the use of the menus of circuit parameters of FIG. 9A, load and source parameters of FIG. 9B, and test tables of FIG. 10.

DETAILED DESCRIPTION OF PREFERRED EMBODIMENTS

Figure 1:
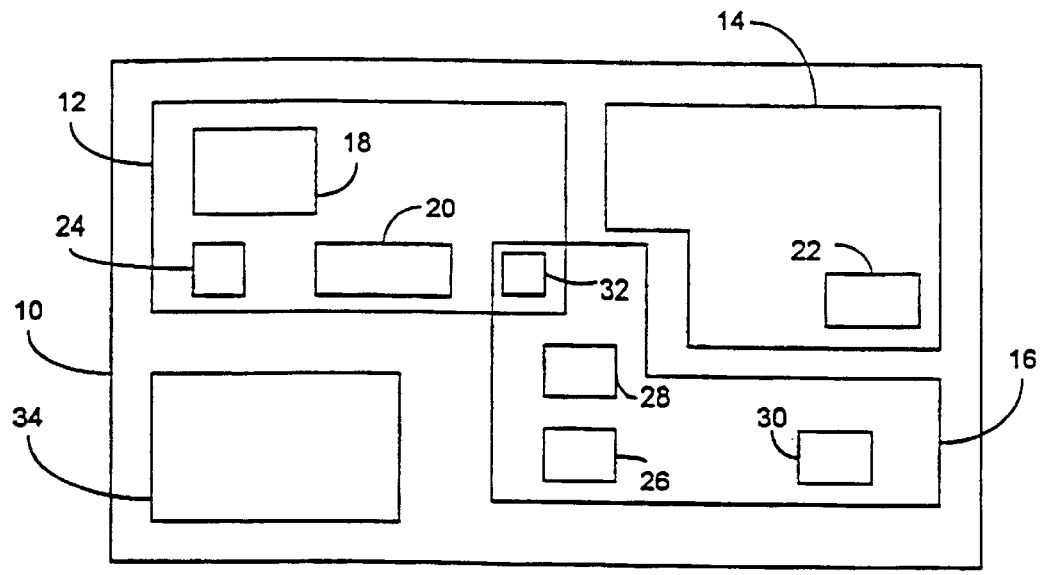
FIG. 1 is a block diagram of a schematic diagram of a typical power supply apparatus being simulated.

FIG. 1 is a block diagram of the schematic diagram of a production circuit, such as a power supply system 10. In its physical form, the power supply is often composed of a printed wire board interconnecting circuit devices, such as integrated circuit (IC) chips and discrete components, made up from a plurality of subsystems 12, 14, 16, and 34. The wire board may be a single or multilayer wire board having conductive traces that interconnect the ICs and discrete components. The subsystems may, for example, be subsystems of a single power supply or may be specialized power supplies of the larger power supply system 10.

The invention is described in connection with simulation of an analog system, including analog systems with significant digital circuit content, in the physical form of a wire board interconnecting ICs and discrete devices. The invention is also applicable to analog systems entirely manifest in ICs and is particularly useful to simulate complex ICs, particularly those with identifiable subsystems. Moreover, although the invention is described in connection with subsystems of a system, it is not necessary to the practice of the invention that the system be segregated to identifiable subsystems. Thus, the principles of the invention are applicable to complete analog systems and ICs.

For large, complex systems, it is often advantageous to divide the system into manageable subsystems for simulation purposes. Once the performance of each subsystem is independently verified, two or more of the subsystems can be combined into a larger subsystem to verify performance of the smaller subsystems working together. In this fashion, the verification of the subsystem performance can be executed efficiently in terms of minimizing the CPU time required. The larger system and subsystem simulations can then be minimized and properly focused on performance issues where the interaction of the smaller subsystems is important. Thus, system 10 is simulated by considering each of user-defined subsystems 12, 14, 16, and 34 one at a time, and then combining the results of all the subsystem simulations upon completion.

Each subsystem 12, 14, and 16 contains a plurality of clubs 18, 20, 22, 24, 26, 28, 30, and 32. There are two types of clubs: function clubs and attribute clubs. A function club comprises a collection of devices that operate together to perform a specified function. Examples of function clubs include amplifiers, pulse width modulators, and FET drivers, and the members of the club are all the electrical devices (e.g., resistors, transistors, and ICs) that operate together to perform the specified function (e.g., the members of the amplifier club operate together to amplify signals, and the members of the pulse width modulator club operate together to provide pulse width modulated signals). An attribute club is comprised of a collection of devices that exhibit a common electrical, mechanical, magnetic, and/or radiant attribute. Examples of attribute clubs include output electrolytic capacitors and power diodes, and the members are all the electrical devices having particular electrical and application attributes. For example, the members of a specific power output capacitor club might include all aluminum electrolytic output capacitors. A function club may include devices that are also members of an attribute club, and vice versa. While all devices of a system to be simulated are members of at least one function club, not all devices that are included in the system are necessarily members of an attribute club.

For a given simulation objective, where one device shares a set of electrical and application attributes with other like devices in the system, it can be advantageous to form an attribute club with those devices and model them in a similar fashion. A given type of device could be represented in more than one attribute club in cases where specific devices of this type have one set of electrical and application attributes in one portion of the system, while other devices of this same type in a different portion of the system have a distinctly different set of electrical and application attributes. Moreover, a single specific device might be shared as to operate with one set of devices to perform a first function and with another set of devices to perform a second function; such specific device would thus be a member of two function clubs.

Several subsystems may overlap such that they share common clubs when operating. Thus, club 32 is included in both subsystems 12 and 16. A typical system 10 will employ plural circuits and plural components of like type, often in more than one subsystem. For example, a 5600 $\mu$F, 10 volt, aluminum electrolytic output capacitor might be employed in several of the subsystems, or a single subsystem might employ several of the capacitors, or both. Likewise, several of the subsystems might employ similar power trains or control circuits. One or more of the subsystems provide signals to one or more other subsystems, such as a bias circuit 34 that provides bias signals to one or more of the subsystems. The bias circuit also may or may not employ devices that are members of an attribute club that includes devices from other subsystems.

Optimal mathematical modeling of a device in one subsystem may differ from the optimal modeling of an identical type of device in another subsystem, depending on the device application and the objective of a given simulation. Because of this, prior to the present invention, it was necessary to engage in a very laborious exercise of manually adjusting the mathematical device models for each critical device in the system to optimally reduce total CPU time. The alternative was to use for all simulations the most detailed mathematical device models, hence usually the most complex mathematical device models to eliminate the need to manually create a large number of simulation schematic diagrams. Unfortunately, the practice of always using the most detailed mathematical device models resulted in a maximization of the CPU time require to perform the desired simulation. The present invention overcomes this difficulty by employing both the attribute clubs and the function clubs.

Figure 2:
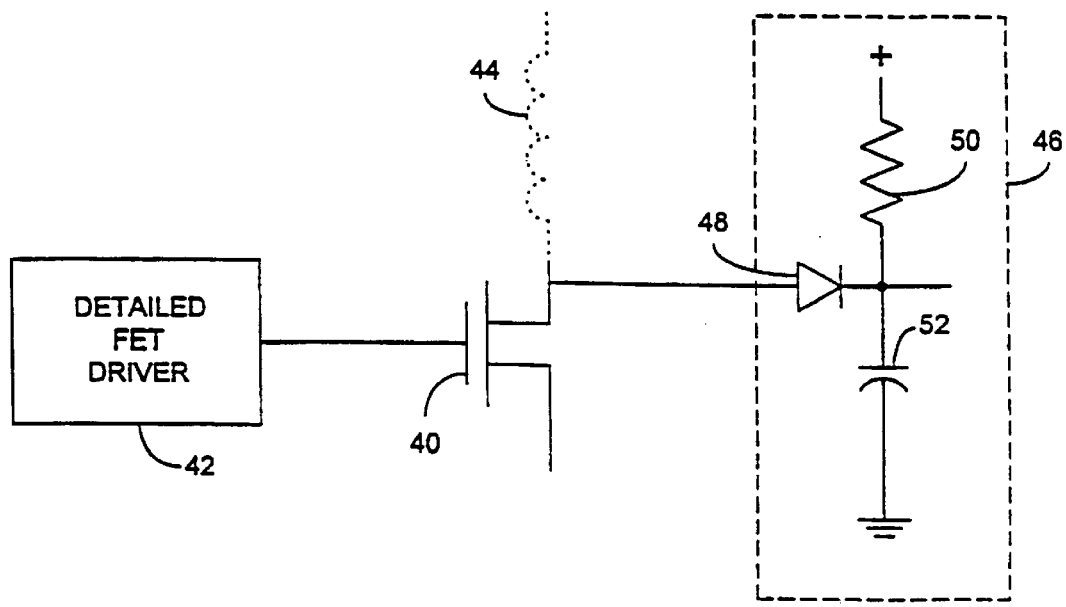
FIG. 2 is a circuit diagram of a field-effect transistor and its driver, as might be simulated using the circuit simulator of the present invention.

In performing a circuit simulation on a system such as circuit 10, various assumptions are made. A typical assumption is that each device can be represented by a lumped-element equivalent circuit of ideal components. The optimal equivalent circuit of a given device may, however, be different from one simulation test objective to the next. For example, FIG. 2 illustrates a field effect transistor (FET) 40 having a gate driven by a complex FET driver 42. As shown in FIG. 2, a power FET 40 is often used in circuits with parasitic inductance effects 44 in the drain circuit. Consequently, it is common to connect a snubber circuit 46 to the drain of FET 40, the snubber circuit being composed of a diode 48, resistor 50, and capacitor 52. A typical snubber has the anode of the diode connected to the drain of FET 40 and the cathode of the diode connected to the junction between resistor 50 and capacitor 52. Under some conditions, the entire circuit of FIG. 2 may be represented as a single ideal switch with series resistance for a given test purpose. For other test purposes, the circuit illustrated in FIG. 2 might be simulated as two components, the FET driver 42 and an ideal FET 40 (treating parasitic inductance 44 and snubber circuit 46 as effectively not there, i.e., superfluous).

In yet other tests, the circuit illustrated in FIG. 2 might be represented as three components, namely the FET driver 42, an equivalent FET 40 (including the parasitic inductance effects in the drain circuit), and the snubber circuit 46 (that compensates for the parasitic inductance effects in the drain circuit). Those skilled in the art will also appreciate that additional equivalent circuits could be appropriate, especially when the equivalent circuits for each of the components of the snubber circuit are considered.

For analog circuit simulators, the numerical complexity of the simulation increases as the number, N, of energy-storing devices and the number, M, of non-linearites increase. The CPU time required to solve circuit equations increases with the square of the number of energy-storing devices times the cube of the number of non-linearities ($N^2 \times M^3$). In general, both N and M increase with the size of the circuit to be simulated. Additionally, both N and M increase dramatically with the complexity of the mathematical device models. As a result, the required simulation CPU time increases rapidly with the size of the system or subsystem to be simulated and the complexity of the device models. The present invention reduces both of these factors while maintaining desired accuracy of results.

A system netlist, which may include all the circuit complexity of a production circuit, defines the system to be simulated. The present invention establishes sets of device models for each device (component and circuit), each set of device models providing mathematical modeling of several equivalent circuits for the device, and derives a system deck describing the system and the various models of the devices in the system. A test-type objective is selected, and a netlist consistent with the test-type objective is selected or extracted from the system deck. Collections of devices are identified based on clubs, and device models are selected or extracted from the system deck at a model level consistent with the simulation tests to be conducted.

The selected models and selected netlist form a test-type deck comprising the netlist and models of the devices in the system consistent with the test-type objective. Test conditions, input/output requirements, and other controls associated with the simulation to be performed are added to the test-type deck; and the simulation test(s) is/are performed. Identification of the netlist and models to be selected is accomplished by a simulation objective matrix that correlates test-type objectives to function and attribute clubs, identifies netlists to be selected on the basis of function clubs, and identifies device models to be selected based on the attribute clubs. The simulation objective matrix is in the form of a database that correlates test-type objectives being employed to function clubs to be included and excluded in the simulation and to device models for the attribute clubs.

Figure 3:
FIG. 3 illustrates equivalent circuits for several levels of models of various circuit components as might be used in tests for the circuit simulator of the present invention.
Figure 3:
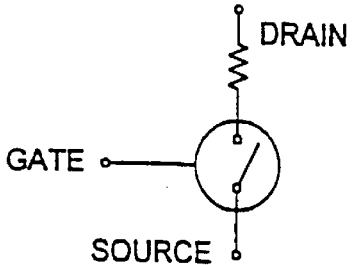
Figure 3:
Figure 3:
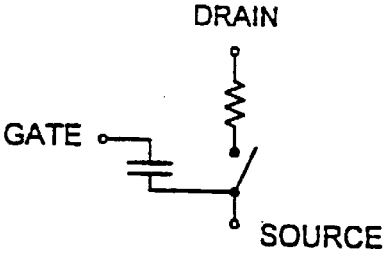
Figure 3:
Figure 3:
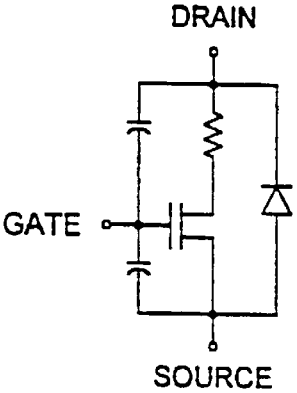

FIG. 3 is a table identifying the equivalent circuits of several levels of device models used in various tests for two exemplary components (devices), which include an output capacitor and a power FET of a power supply. Devices of the same type may have the same models, even though different devices of the same type may have different values for the electrical parameters. Thus, a power FET having a given set of electrical parameters may have the same set of mathematical device models (and model levels) as another power FET having a different set of electrical parameters; likewise, an output capacitor having a given set of electrical parameters may have the same set of mathematical device models and model levels as another output capacitor having a different set of electrical parameters.

In FIG. 3, the left column identifies model level numbers, the center column illustrates the corresponding equivalent circuits defining the device models for the output capacitor, and the right column illustrates corresponding equivalent circuits defining the device models for the power FET. Thus, the output capacitor might be represented as an ideal capacitor (model level I); as an ideal capacitor and parasitic equivalent series resistance (model level II); or as an ideal capacitor, parasitic equivalent series resistor, and parasitic equivalent series inductor (model level III). Likewise, the power FET might be represented as a simple switch in series with an ideal resistor (model level I); as the simple switch and resistor as in model level I with an gate-to-source capacitor (model level II); or as the equivalent circuit for model level II with a gate-to-source capacitor and the simple switch replaced by a FET model describing the active region as well as the saturation and cutoff regions of operation with a parasitic body diode and gate-to-drain capacitance (model level III).

Depending upon the test being conducted, a given component of one of these device types is represented by one of the device model levels illustrated in FIG. 3. Thus, the capacitor or power FET may be modeled in various manners (model levels) to represent the several equivalent circuits of the device. The several models may be expressed mathematically, either as an analytical model, equivalent circuit, or a numerical model, and each mathematical device model is designated a model level. In the examples of FIG. 3, the output capacitor and the power FET are each expressed by three mathematical models, equivalent to the three equivalent circuits, and the models may be assigned model levels, numbered I to III in the examples. While the model levels are often expressed in consecutive numerical order to indicate increasingly complex equivalent circuits, the expressions may be any convenient expression, alphanumeric or otherwise, and the complexity assignment may be in any order, including random and pseudo-random.

Moreover, each device may have any number of models and model levels, and the three given herein are for purposes of explanation and not of limitation. Each mathematical model is, however, assigned to at least one model level, and a given model level of a device refers to a single mathematical model. As will become apparent hereinafter, because the invention permits selecting different model levels for each club for a given test, there is no need to assign a single mathematical model to more than one model level.

The devices are arranged in "clubs," with each member of the club having a common feature to each other member of the club for at least one test-type objective. Thus, members of an attribute club exhibit a common electrical, mechanical, magnetic, or radiant attribute and have a common specified device model level for at least one test-type objective. Likewise, members of a function club share the common feature of operating together to perform a specified function. Thus, power FETs of a given type might form a single attribute club, distinct from other FETs of a different type. Conversely, power FETs for the main switching function in power supplies might form a single attribute club with other power FETs, regardless of type, that perform the same application function, yet are included in different function clubs.

Hence, a power FET of a given type that functions as the main switch in a 3 volt converter may be a member of the same attribute club as a power FET of a different type that functions as the main switch in a 48 volt converter. The reason for this is that all members of an attribute club have a common specified device model level for at least one test-type objective. Thus, all of the FETs of the attribute club share the same mathematical model level for at least one test-type objective. Hence, a test-type objective seeking to determine step load transients will employ the same model of the power FET, regardless of whether the converter is a 3 volt or 48 volt converter.

Figure 4:
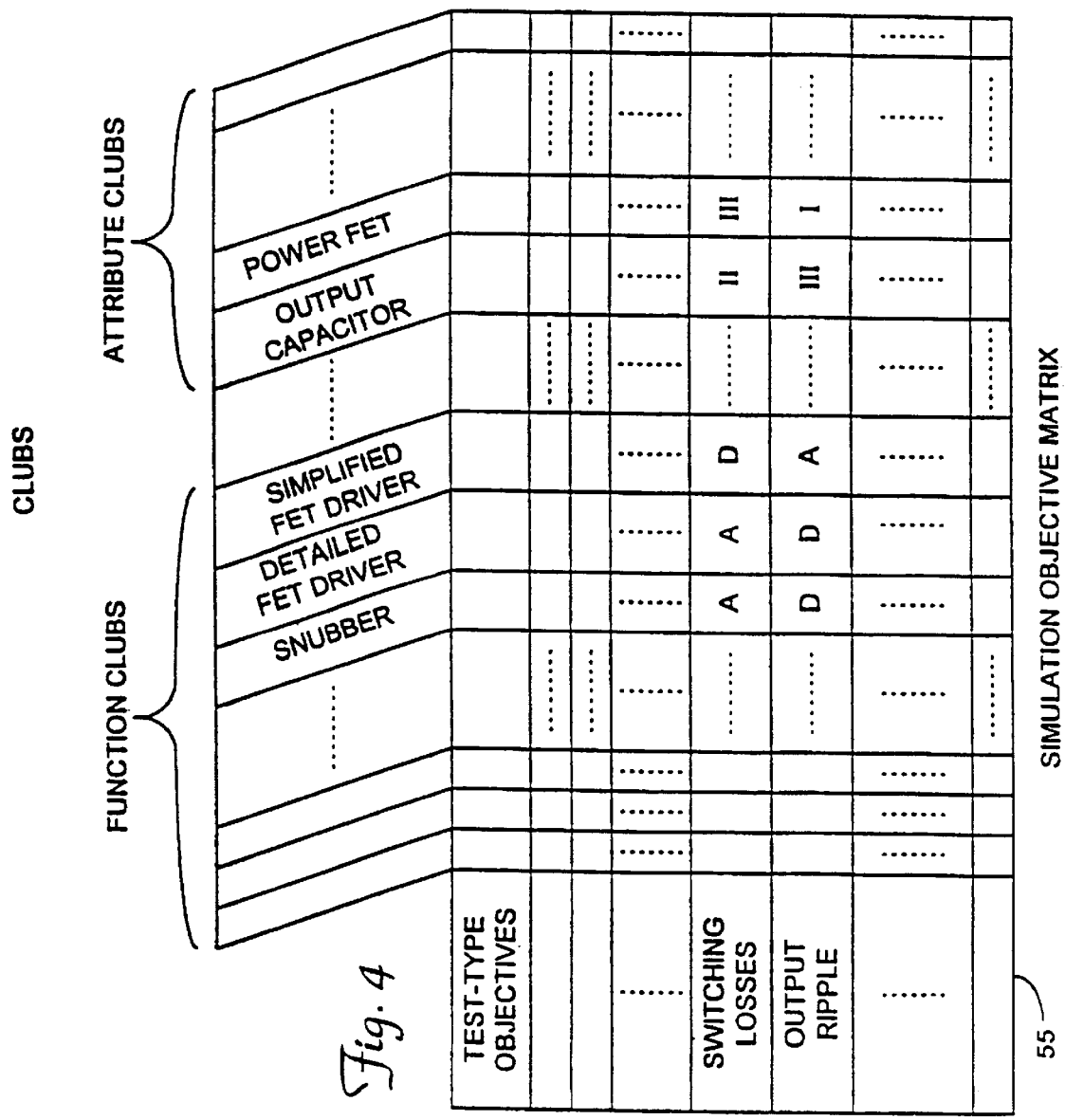
FIG. 4 illustrates a simulation objective matrix database correlating test-type objectives and clubs, which matrix database is used to select function clubs and model levels of attribute clubs that might be used in connection with circuit simulation in accordance with the present invention.

FIG. 4 illustrates a simulation objective matrix 55 embodied in a database in accordance with the present invention. While the present invention will be described in connection with the simulation of electrical properties of circuits containing circuit components and subsystems that are operated under various conditions, the clubs may represent properties other than electrical properties and may be manifest as either hardware or software.

The vertical columns of the matrix of FIG. 4 identify function and attribute clubs. The horizontal rows illustrate test-type objectives to be performed on system 10, including the several subsystems and the devices contained therein. Thus, the test-type objectives identify the objectives of the simulation tests to be performed for the system or subsystem.

The matrix of FIG. 4 performs two functions, the first of which is that it correlates the test-type objectives to select and de-select the function clubs of each subsystem or system. As an example, a test of the output ripple of a power supply employing the FET circuit of FIG. 2 with an output capacitor would select the simplified FET driver, but de-select (treat as superfluous) the detailed FET driver and snubber clubs. (The simplified FET driver model is a simplified model that ignores effects of parasitic inductance at the drain; the detailed FET driver model models the driver to be affected by the parasitic inductance.) The selection process results in the reduction of the size and complexity of the netlist that will eventually be submitted to the simulation engine to perform the simulation for this particular test-type objective.

The second function of the simulation objective matrix is to identify the device model level of each attribute club for the selected test-type objective. The attribute clubs comprise critical components, such as output capacitors (in the case of power supplies) and power semiconductors. Thus, in the case of the output ripple test objective, the mathematical model of the power FET will represent the equivalent circuit illustrated at model level I in FIG. 3. The output capacitor would, however, be modeled as represented by the equivalent circuit of model level III in FIG. 3. On the other hand, if the test is of the switching losses, the detailed FET driver and snubber circuits would be selected as separate clubs and the simplified FET driver would be de-selected. The output capacitor would be modeled more simply by the resistor/capacitor equivalent circuit of model level II in FIG. 3, whereas the power FET will be modeled as the more complex equivalent circuit of model level III in FIG. 3.

Figure 5:
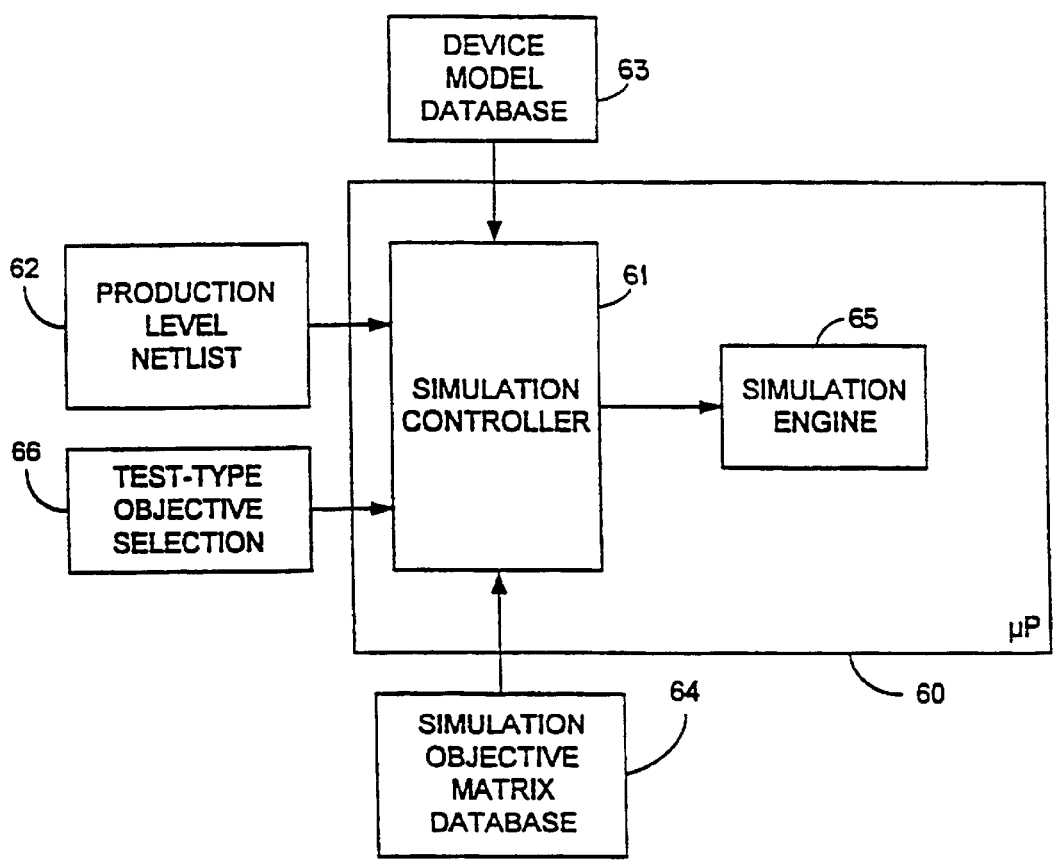
FIG. 5 is a block diagram of a computer system employing the circuit simulation of the present invention.

FIG. 5 is a block diagram of a computer system for circuit simulation in accordance with the present invention. A microprocessor 60 includes a simulation controller 61 that receives a production level netlist 62 of the system 10 being simulated. Controller 61 also receives all device models (all levels) for a plurality of devices, including all devices in system 10, from a database 63, as well as data from a simulation objective matrix database 64. Simulation objective matrix database 64 is illustrated in FIG. 4. Finally, controller 61 receives test-type objectives, defined at 66 by the user. Microprocessor 60 additionally contains software to perform the process illustrated by the flowchart of edge-matched FIGS. 6A and 6B to derive a test-type deck and to perform circuit simulation using a simulation engine 65. FIG. 7 is a graphical representation of the process of preparing the test-type deck for processing by simulation engine 65.

Figure 6A:
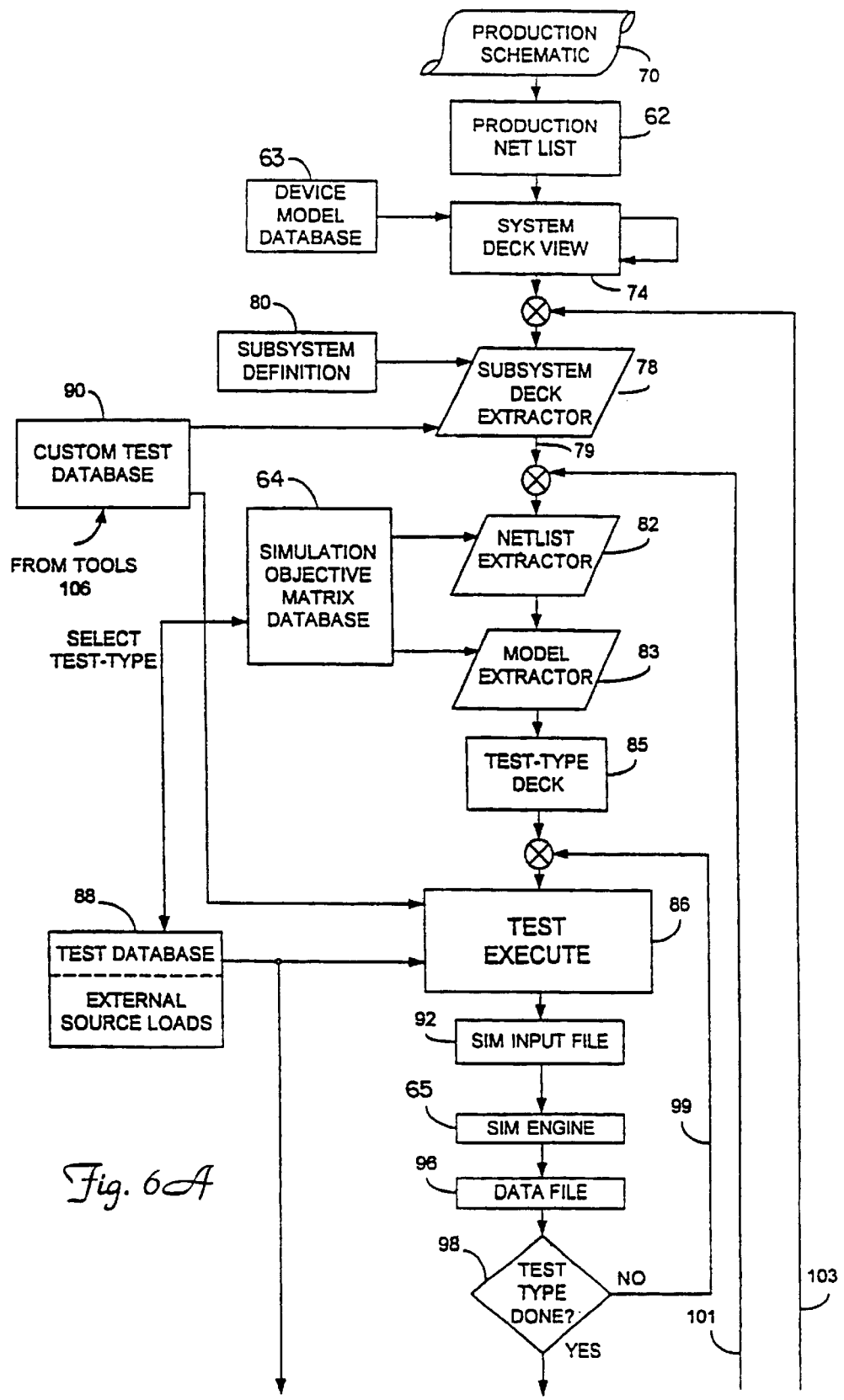
FIGS. 6A and 6B are edge matched to form a flow chart of the process employed by the computer system illustrated in FIG. 5 in carrying out the circuit simulation in accordance with the present invention.
Figure 6B:
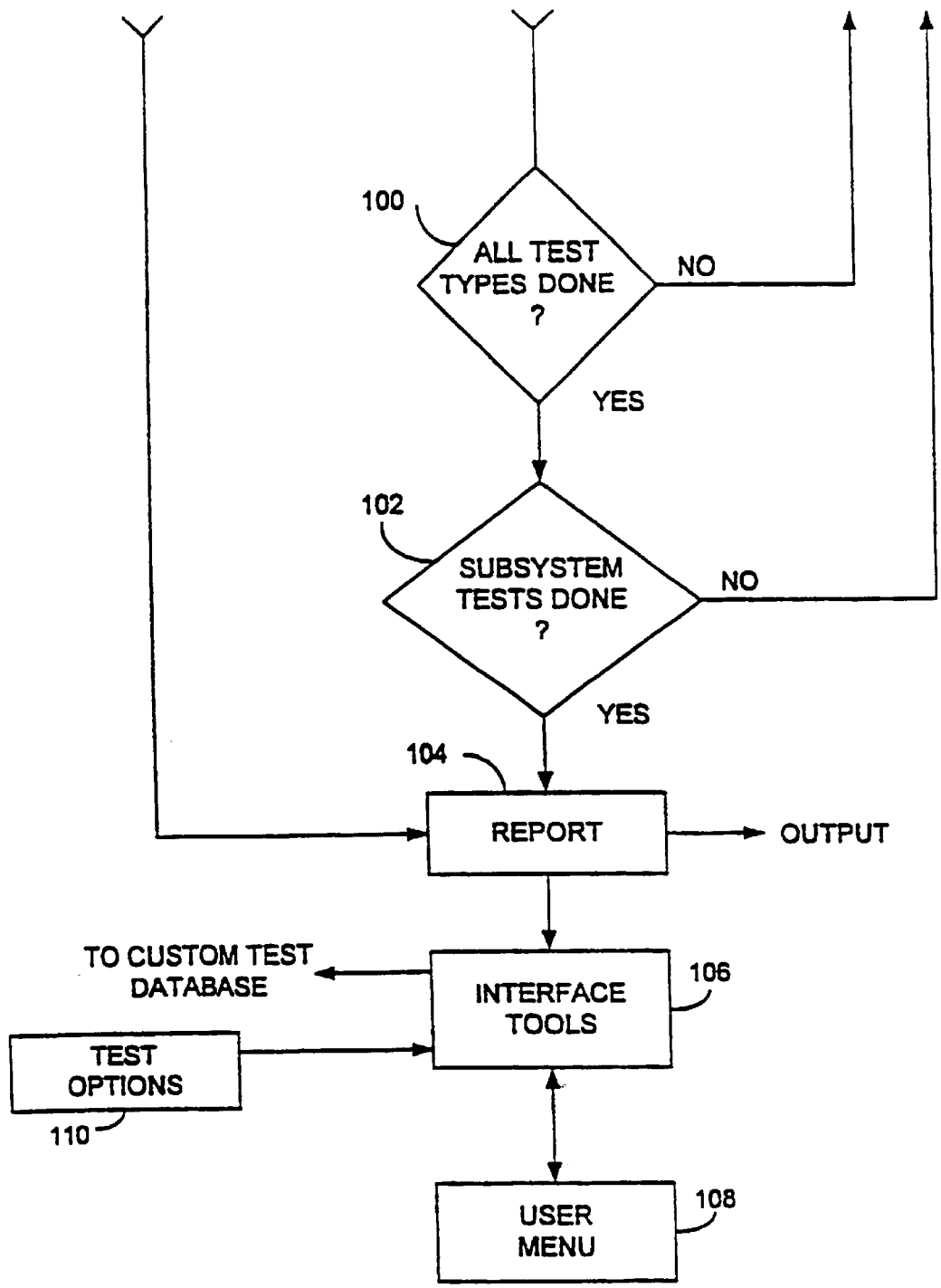
Figure 7:
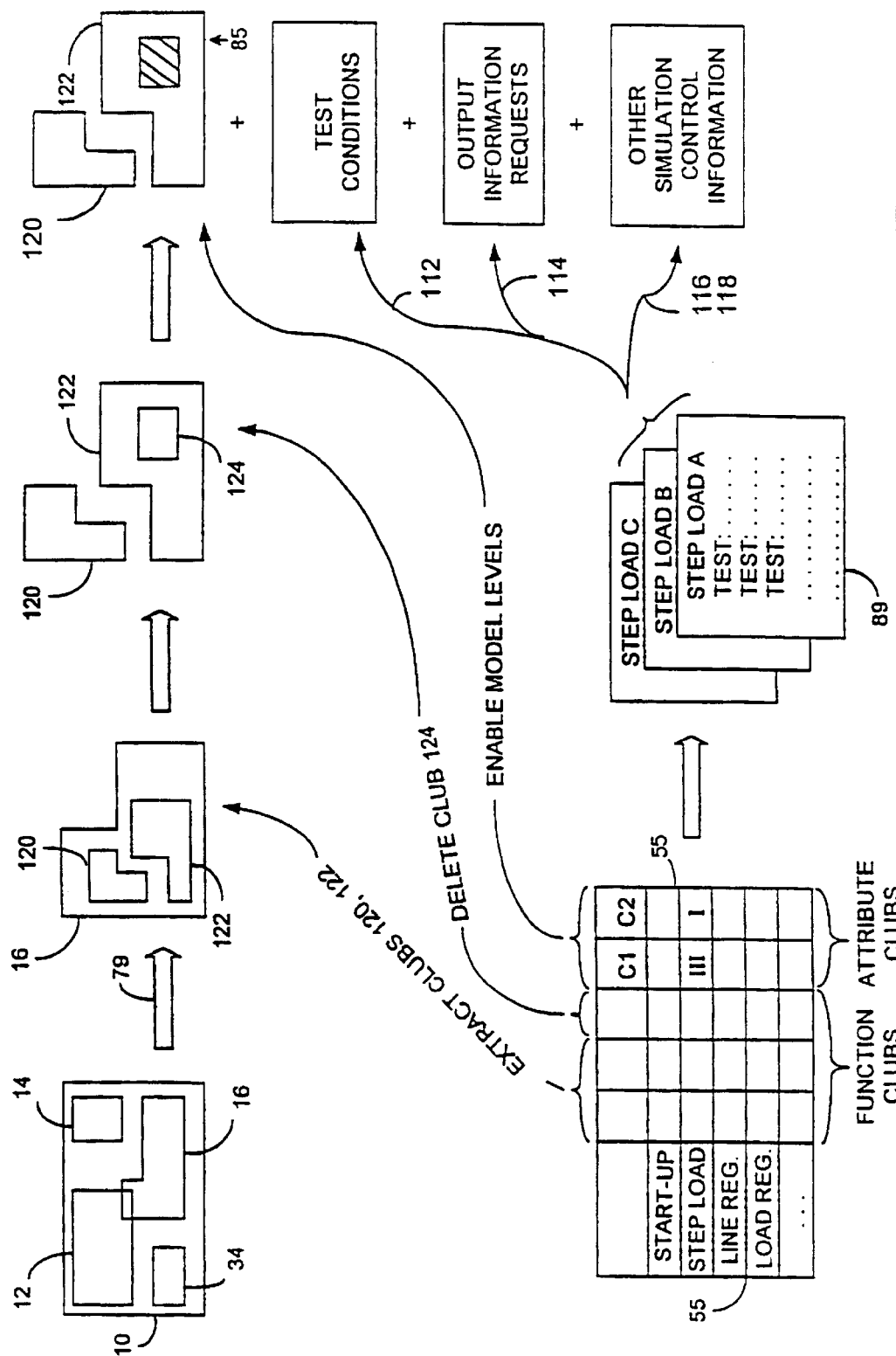
FIG. 7 is a graphical representation of the circuit simulation input preparation carried out by the process shown in FIGS. 6A and 6B.

Referring to FIGS. 6A and 6B, production netlist 62 is generated from a production schematic 70. Production netlist 62 is a definition of interconnected devices that perform the electrical function of the system 10. The production netlist defines the entire circuit of the system in the form of components and circuits (devices) and subsystems, including connections of device nodes to circuit nodes. Where the system includes, or is, an integrated circuit, the production netlist includes, or is, the completed integrated circuit file for the IC as generated by a schematic or netlist and defines the logical functions of ICs. Device model data, reflecting all levels of the device models of the components and circuits (devices) of the system, are added to the production netlist 62 from database 63 to form a system deck 74. Alternatively, as described below, the device model data may be selected and added to the production netlist to form the system deck as part of the model selection process.

System deck 74 is provided to a subsystem deck extractor 78. Deck extractor 78 also receives user-defined subsystem definitions at 80. Subsystem deck extractor 78 maps the circuit elements of system deck 74 into individual user-defined subsystems 12, 14, 16, and 34 (compare FIGS. 1 and 7) to extract or select a subsystem deck 79 for one of the subsystems (such as subsystem 16 in FIGS. 1 and 7). Subsystem deck 79 includes the collection of device models at all levels for the user-defined subsystem and the completed netlist for the subsystem. The subsystem deck thus defines the logical and functional aspects of the selected subsystem 16. It will be appreciated by those skilled in the art that the subsystem definition data provided at 80 are user-defined data based on the circuit 10 being simulated and may be embodied in a database. It will also be appreciated that the device data provided by database 63 are standardized analytical or numerical representations of the components and circuits whose operation is to be simulated. Thus, while the subsystem is user-defined, database 63 is pre-established. If other or additional devices are required to be defined, data may be provided to a database 90 to establish definitions for special components and circuits, as well as test procedures for them.

A netlist extractor 82 and a model extractor 83 receive subsystem deck 79 for the selected subsystem from deck extractor 78. Extractors 82 and 83 also receive netlist selection instructions and model level information from a simulation objective matrix database 64, which is described in greater detail with reference to FIG. 4. The user selects a test-type objective that operates on database 64 to identify function clubs to be added (A) or deselected (D) or ignored (–) and to identify the model levels of the devices of the attribute clubs, both based on the matrix of FIG. 4. Based on a selected test-type objective, netlist extractor 82 selects from subsystem deck 79 the netlist that corresponds to the selected test-type objective, and model extractor 83 selects or extracts the mathematical device models for subsystem deck 79 for the attribute clubs at the model levels associated with the selected test-type objective. As explained below, the selection process may be an additive or a subtractive process.

In some cases, it might be convenient to design the subsystem netlist to not include mathematical device models for the devices. In such cases, the mathematical device models are selected at the appropriate model level by selecting a test-type objective for simulation objective matrix database, which in turn selects the appropriate level of the mathematical device model from database 63. The selected mathematical model is added to the netlist by model extractor 83. In most cases, however, it will be most convenient to include mathematical device models in the subsystem netlist and select them as previously described.

Extractors 82 and 83 provide a test-type deck that enables a device model for each member of the attribute clubs of the subsystem at a model level that is defined by the test-type selection in the simulation objective matrix under consideration. The resulting test-type deck is assembled in a manner consistent with the test-type objectives and in the simplest configuration consistent with the simulation tests to be performed for the test-type objectives. As will be explained below, when all of the tests are complete for one test-type objective, the process will iterate through all of the tests for each of the remaining test-type objectives associated with each subsystem. Thus, based on the subsystem selected at 78, extractors 82 and 83 identify netlists and model levels using database 64 and interactively select specific netlists and device models for each test-type objective from netlist 79. These selected netlists and device models are of the simplest form consistent with achieving the test-type objective. Each of the test-type objectives usually involves a tradeoff between the accuracy of the results and the time required to obtain the results. This invention permits a dramatic improvement in CPU time reduction while achieving results at a desired accuracy level.

Using function club identification from database 64 (that is, club data illustrated in the matrix of FIG. 4), netlist extractor 82 selects netlist data from deck 79 concerning function clubs 120 and 122 for subsystem 16 for inclusion in the simulation test to be performed. Netlist extractor 82 also deletes any function club netlist data for any club (such as club 124) being de-selected. For example, as described above, if an output ripple test-type objective is selected (see FIG. 4), the function club representing the simplified FET driver would be selected, but the function clubs representing the FET driver and snubber circuits separately would be de-selected. Likewise, model extractor 83 uses model level data from database 64 to select specific device models for inclusion in the test-type deck.

While extractors 82 and 83 have been described as separate units, in practice they may be a single test-type deck extractor associated with database 64 to select both the netlist and device models from the subsystem deck. The selection process may be additive or subtractive. For example, the device models could be stored in a separate database and selected and added to the test-type deck as needed. Alternatively, the subsystem deck might already contain all model levels of all devices used, and the selection process merely enables the appropriate level for each device as defined by the simulation objective matrix. As yet another alternative, the subsystem deck might contain all model levels of all devices, and the selection process extracts the appropriate level for each device as defined by the simulation objective matrix and constructs a new test-type deck. Moreover, although the invention is described as selecting the netlist and then the device models, in practice the selection may be in any order, or together. It is preferred, however, that a sufficient part of the netlist be selected to eliminate de-selected function clubs before selecting device models for the part, thereby avoiding unnecessary device model selection for devices that are de-selected by a de-selected function club.

Example I is an example of a deck 79 containing mathematical device models of a power transistor of a circuit under simulation, and Example II is an example of a deck 79 containing mathematical device models of an output capacitor.

EXAMPLE I

```
XQ31 10020 100 101 transistor1
*d:/Per1/bin/Part_Templates0/q.ztx750.a.22904985.subckt
**Ztx750 PNP Bipolar 22904985
**node order: b, c, e
*
.SUBCKT transistor1 2 1 3
*
** i(SS1) = current into n+(1) node of SS1
** i(QQ1) = current into n+(1) node of QQ1
** i(!RBEQ) = current into n+(2) node of !RBEQ
*
*LIM;vce=v(1,3)
*L1M;vbe=v(2,3)
*LIM;iswitch=i(SS1)
*LIM;power=vce*iswitch
*
*L2M;vce=v(1,3)
*L2M;vbe=v(2,3)
*L2M;iswitch=i(QQ 1)
*L2M;ibase=i(!RBEQ)
*L2M;power=vce*iswitch=vbe*ibase
*
*max_vbe=5V
*max_vec=45V
*max_iswitch=6A
*min_iswitch=-0.02A
*max_ibase=0.6A
*
*L1;SS1 3 1 !RBEQ ztx750 IC=CLOSE
*L1;.MODEL ztx750 ICSW RON=1 ROFF=1MEG
*L1;+TH=0.001 HYSTWD=0.000005 LOGIC=POS
*L1;!RBEQ 3 2 MRDM IC=1
*L1;.MODEL MRDM VPWLR NSEG=2
*L1;+X0=0 Y0=0
*L1;+X1=0.6 Y1=30e-6
*L1;+X2=0.85 Y2=0.013
*
*L2;QQ1 3 1 !RBEQ MQQIM IC=OPEN
*L2;.MODEL MQQIM ICQPOS VSAT=0.05 RSAT=0.1 ROFF=1000000
*L2;+GAIN=30 TH=0.00001 HYSTWD=0.000001 LOGIC=POS
   LEVEL=2 FLOW=UNIDIR
*L2; !RBEQ 3 2 MRDM IC=1
*L2;.MODEL MRDM VPWLR NSEG=2
*L2;+X0=0 Y0=0
*L2;+X1=0.6 Y1=30e-6
*L2;+X2=0.85 Y2=0.013
*
.ENDS transistor1
```

Example I defines a bipolar PNP transistor ("transistor1") whose collector, base, and emitter connections are at device nodes 1, 2, and 3, respectively, and which has a maximum base-emitter voltage of 5 volts, a maximum emitter collector voltage of 45 volts, maximum and minimum switch currents of 6 amperes and −0.02 ampere, respectively, and a maximum base current of 0.6 ampere. The first line "XQ31 10020 100 101 transistor1" identifies the transistor in the netlist of the subsystem, and the next several lines and the lines identified by "max" define the characteristics of the transistor and its connection in the subsystem. The lines identified as L1 and L2 describe the function of the transistor in accordance with the behavioral circuit model of the transistor for two device model levels (identified as L1 and L2).

Example II defines a 5600 μF, 10 volt aluminum electrolytic output capacitor identified as "capacitor10" in the device model database 76. Here, the behavioral circuit model of the capacitor for three device model levels are identified, levels L1–L3. For the device model level L1, the capacitor model has two device nodes 1 and 2, which are the output nodes, and exhibits the characteristics of an ideal capacitor having a capacitance of 5600 μF (designated 5600-e6). For the device model level L2, the capacitor model has three device nodes 1, 2, and 3, where the output nodes are nodes 1 and 2, and the capacitor exhibits the characteristics of a series ideal resistor having a resistance of 0.18 Ohm between nodes 1 and 3 and an ideal capacitor having a capacitance of 5600 μF between nodes 3 and 2. For the device model level L3, the capacitor model has four device nodes 1, 2, 3, and 4, where the output nodes are nodes 1 and 2, and the capacitor exhibits the characteristics of a series ideal resistor having a resistance of 0.18 Ohm between nodes 1 and 3, an ideal inductor having an inductance of 10 nanoHenries between nodes 3 and 4, and an ideal capacitor having a capacitance of 5600 μF between nodes 4 and 2. It will be appreciated that the equivalent circuits for the three device model levels L1, L2, and L3 in Example II correspond to the three equivalent circuits illustrated for the output capacitor for model levels I, II and III in FIG. 3.

EXAMPLE II

```
XC 1521 114 50028 capacitor10
*d:/Per1/bin/Part_Templates0/c.5600uf_10v.a.40061247.subckt
** OUTPUT CAPACITOR
*
**5600uF, 10V, aluminum electrolytic 22908796
*
.SUBCKT capacitor10 1 2
*
*L1M;vc=v(1,2)
*
*L2M;vesr=v(1,3)
*L2M;vc=v(3,2)
*L2M;iesr=j(RESR)
*L2M;power=vesr*iesr
*
*L3M;vesr=v(1,3)
*L3M;ves1=v(3,4)
*L3M;vc=v(4,2)
*L3M;iesr=i(RESR)
*L3M;power=vesr*iesr
*
*max_vc=10V
*max_iesr(RMS)=4.4A
*
*L1;CC 1 2 5600e-6 IC=0
*
*L2;RESR 1 3 0.018
*L2;CC 3 2 5600e-6 1C=0
*
*L3;RESR 1 3 0.018
*L3;LESL 3 4 10e-9 IC=0
*.L3;CC 4 2 5600e-6 IC=0
*
.ENDS capacitor10
```

With continued reference to FIGS. 6A and 6B and with reference to the illustration of FIG. 7, each test-type objective is exemplified in matrix 55 in FIG. 4 and represents a plurality of tests to be performed. The netlist selected by netlist extractor 82 and the mathematical models selected by model extractor 83 for the given test-type objective are collected in test-type deck 85. Database 88 supplies definitions of the tests associated with the test-type objective selected, as well as user-defined test requirements (including input and output requirements, load and source data, and other external test conditions corresponding to the selected test-type objective) at test execute 86. The load and source data represent the load conditions, power supply conditions, and input conditions to the subsystem under test and are supplied by user menu 108 (FIG. 6B). Thus, the test-type deck, the definitions of the tests to be performed, and the user-defined requirements (including output information to be derived) are collected at test execute for the selected test-type objective. A simulation input file or simulation deck 92 is formed from the data collected at test execute 86 and is provided to simulation engine 65, such as a Simplis® engine, which is available from Transim Technology Corporation, the assignee of the present application. Simulation deck 92 thus includes the test definitions and user-defined test requirements from database 88, as well as the test-type deck from extractors 82 and 83. As described above, the test-type deck includes netlist data for the portion of the subsystem netlist associated with the selected function clubs and the appropriate device models of the members of the selected attribute clubs.

FIG. 7 illustrates an alternative way of visualizing this process of creating the simulation deck or simulation input file 92 in connection with a complete system 10 made up of subsystems 12, 14, 16, and 34. A user carries out subsystem extraction process 78 to extract subsystem 16 from system 10. The user then selects the "Step Load" test-type or simulation objective. Referring to the simulation objective matrix 55, a user selects function clubs 120 and 122 to first identify the clubs within subsystem 16 that are to be included in the test-type deck. Based on this particular simulation objective, the simulation objective matrix identifies for deletion from the test-type deck those components in subsystem 16 that are in club 124 and in either of club 120 or club 122. In this graphical example, of those components in subsystem 16, the resulting test-type deck 85 is composed of the components belonging to club 120 and the components belonging to club 122 after the components of club 124 have been removed.

To complete test-type deck 85, the user then includes the appropriate component model levels for each component contained in test-type deck 85 that is also a member of one of the attribute clubs called out in the simulation objective matrix 55. In the example of FIG. 7, components belonging to club C1 are modeled at level III, while components belonging to club C2 are modeled at level I.

The user next adds to the test-type deck 85 those statements needed to complete the simulation deck or simulation input file 92 (FIG. 6A). Test database 88 (FIG. 6A) can be organized into test tables 89, which are grouped together by simulation objective. As indicated in the example of FIG. 7, for the "Step Load" simulation objective, there are three test tables, which include STEP LOAD A, STEP LOAD B, and STEP LOAD C. Each test table can contain any number of individual tests. The information that must be added to the test-type deck to make a complete simulation deck is contained in the definition of each test. This information includes test conditions 112, measurement conditions 114, initial conditions 116 for the circuit, and other simulation control information 118 such as the desired duration of the simulation. A user adds to the test-type deck 85 properly formatted input statements based on this information to form the simulation deck or the simulation input file 92 (FIG. 6A). At this point, the simulation deck is ready to be submitted to the simulation engine for processing.

Referring to FIG. 6A, engine 65 executes the tests, based on simulation input file 92, to create or add to a data file of test results that are accumulated and stored at data file 96. Upon completion of a simulation test, determination is made at 98 as to whether all of the tests have been completed for the selected test-type objective. If they have not, the process loops back through loop 99 to test execute 86 to perform the next test of the test-type objective. Thus, test execute 86 defines tests for the several test-type objectives, the tests being iteratively executed and the results being accumulated in data file 96 until all of the tests for the selected test type objective have been completed.

When all of the tests for a given test-type objective have been completed, a decision is made at 100 as to whether all of the test-type objectives have been completed for the subsystem under test. For example, if another test-type objective defining another set of tests has been or is requested to be performed on the same subsystem selected by extractor 78, the process loops back through loop 101 to netlist extractor 82 to select another test-type objective (set of tests) for the subsystem. As explained above, the new test-type objective might require a different netlist selection and new model levels for various attribute clubs, causing netlist extractor 82 to select a different netlist from subsystem deck 79 and model extractor 83 to select different mathematical device models for the devices from deck 79. The new tests are iteratively executed as described above to accumulate the results in data file 96. Upon completion of all of the test-type objectives for the selected subsystem, a decision is made at 102 as to whether all of the subsystems have been processed. If they have not, the process loops back through loop 103 to step 78 to select a new subsystem, such as subsystem 14, from system deck 74. A new set of clubs is associated with the new subsystem. Hence, deck extractor 78 selects new clubs, and extractors 82 and 83 select different netlists and mathematical device models. The process continues interactively through loops 99, 101, and 103 until the circuit simulation has been completed and data file 96 contains the accumulated results data for the entire set of tests for system 10.

At this point, a report 104 may be produced and may be supplied to interface tools 106 for user use in generating or modifying custom test database 90. With user menu 108, interface tools 106 may be used with test options 110 to customize the test database.

Use of the invention to simulate a system can be explained with reference to FIGS. 8–10. More particularly, the use of the invention will be described in connection with the simulation of a power supply depicted in FIG. 8, using the menus of club parameters of FIG. 9A, load and source parameters of FIG. 9B, and test tables of FIG. 10.

Figure 8:
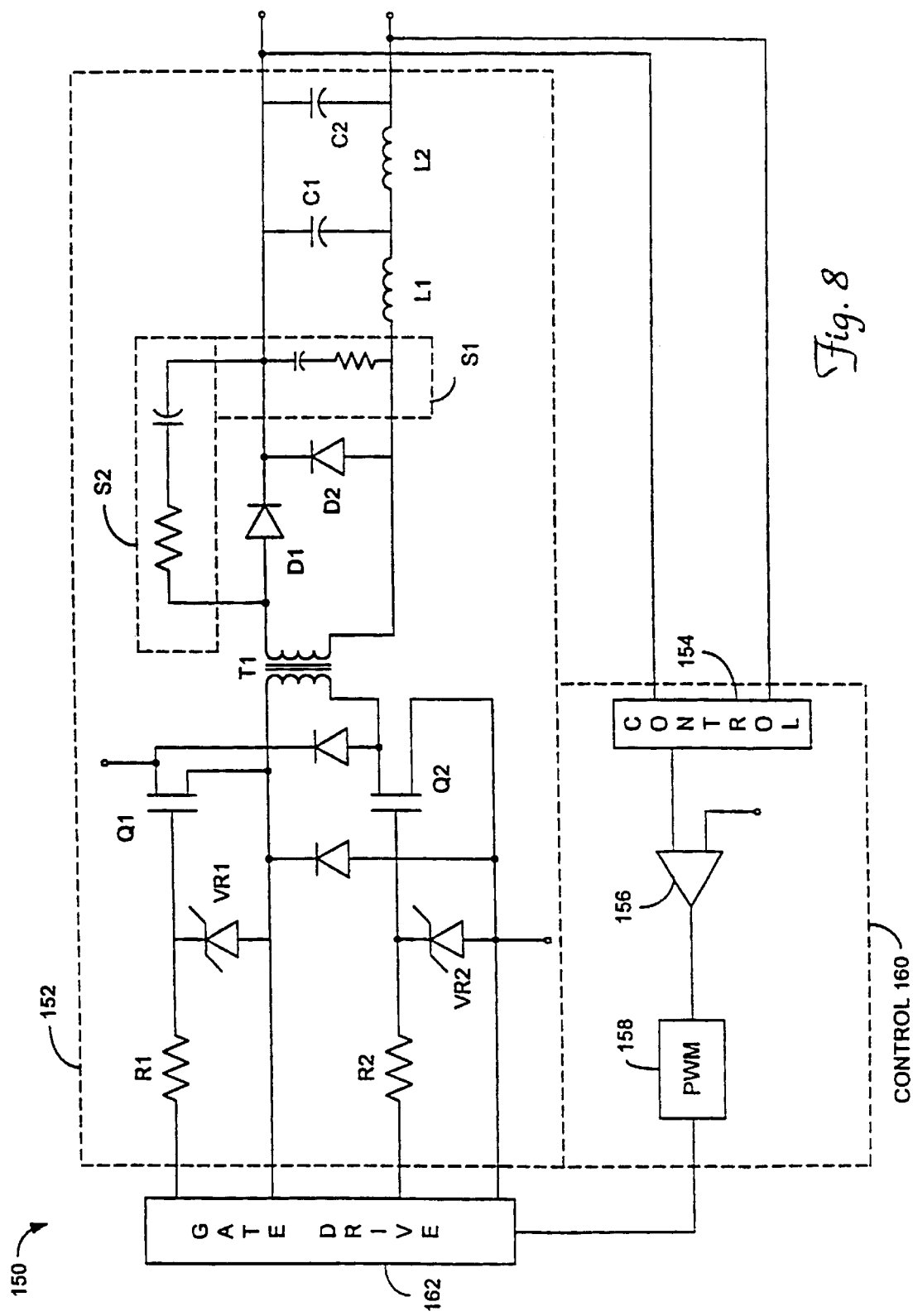

FIG. 8 is a block circuit diagram of a portion of a power supply employing a subsystem 150 known as a two transistor forward subsystem. Subsystem 150 includes a power stage club 152, an overvoltage and overcurrent control 154, error amplifier 156, and pulse width modulator (PWM) 158. Control 154, amplifier 156, and modulator 158 may comprise a larger control club 160, which provides an output to a gate drive club 162 that operates the gates of FETs Q1 and Q2 in power stage club 152. For purposes of the example, FETs Q1 and Q2 have their gates connected through respective resistors R1 and R2 to gate drive 162, and have one of their controlled terminals connected to opposite sides of the primary winding of a transformer T1. The secondary winding of transformer T1 is connected through a diode D1 and an inductor L1 to an output capacitor C1, and through an inductor L2 to an output capacitor C2. A snubber circuit S1 (which itself may be a member of a function club), comprises a series-connected capacitor and resistor and is connected across a diode D2. A second snubber circuit S2 comprising a series-connected resistor and capacitor is connected across diode D1.

FIGS. 9A and 9B illustrate menus that might appear to the user on the display screen of the computer system illustrated in FIG. 5. Using the menu, a user may provide as inputs device parameters (FIG. 9A) and circuit specifications of loads and sources (FIG. 9B) for the circuit of FIG. 8. FIG. 10 is a menu representing what might appear to the user on the display screen of the computer system shown in FIG. 5.

The values (parameters) of the circuits and components of the function clubs comprising power stage 152, control 154, error amplifier 156, pulse width modulator 158, and gate drive 162 are selected by the designer using the menu of FIG. 9A. The circuit specifications are selected by the designer using the menu of FIG. 9B. The external loads and sources (e.g., power requirements and external signal levels) for test-type objectives are selected by the designer using the menu of FIG. 10.

The menu of FIG. 9A presents a list of devices (components and circuits) of power stage club 152 and prompts the user to insert values into each of multiple data entry fields 170. Each data entry field 170 corresponds to a variable associated with a designated device. Thus, as illustrated in FIG. 9A, information is requested as to the value of the resistance (in Ohms) of resistors R1 and R2, the inductance (in Henries) of inductors L1 and L2, and the capacitance (C), resistance (R), and inductance (L) of power output capacitors C1 and C2. (Power output capacitors have an equivalent circuit as illustrated in model level III in FIG. 3 for which its equivalent series resistance and inductance are required for modeling).

The menu also prompts the designer for information concerning transformer T1, particularly the number of turns on the primary and secondary windings, magnetic flux leakage, magnetic field strength, and resistance of the primary and secondary windings.

The designer inserts information concerning the prompted parameters. Thus, initially, each of resistors R1 and R2 has a resistance of 10 Ohms; inductor L1 has an inductance of 130 nanoHenries; inductor L2 has an inductance of 1.7 microHenries; capacitor C1 has a capacitance of 11,200 microFarads, resistance of 0.009 Ohm, and an inductance of 10 nanoHenries; and capacitor C2 has a capacitance of 16,800 microFarads, resistance of 0.006 Ohm, and an inductance of 10 nanoHenries. Transformer T1 has a primary winding of 52 turns and a resistance of 0.010 Ohm, a secondary winding of 2 turns and a resistance of 0.001 Ohm, has a magnetic field strength of 0.008 Henry, and a flux leakage of 15 microHenries. Similar information is prompted for the devices of the clubs comprising control 154, error amplifier 156, pulse width modulator 158, and gate driver 162.

While club 152 includes a pair of snubbers, these have been effectively de-selected by the de-selection process described with reference to FIGS. 6 and 7. Accordingly, the menu of FIG. 9A does not require information concerning the snubber circuits S1 and S2.

Similarly, source and load information required for the simulation is prompted as illustrated in the menu shown in FIG. 9B. Here, the designer inserts data into data entry fields 172 concerning nominal voltages and permitted variations, primary and secondary bias voltages, step load slew rates, and output voltages and currents (as required for the loads).

Figure 10:
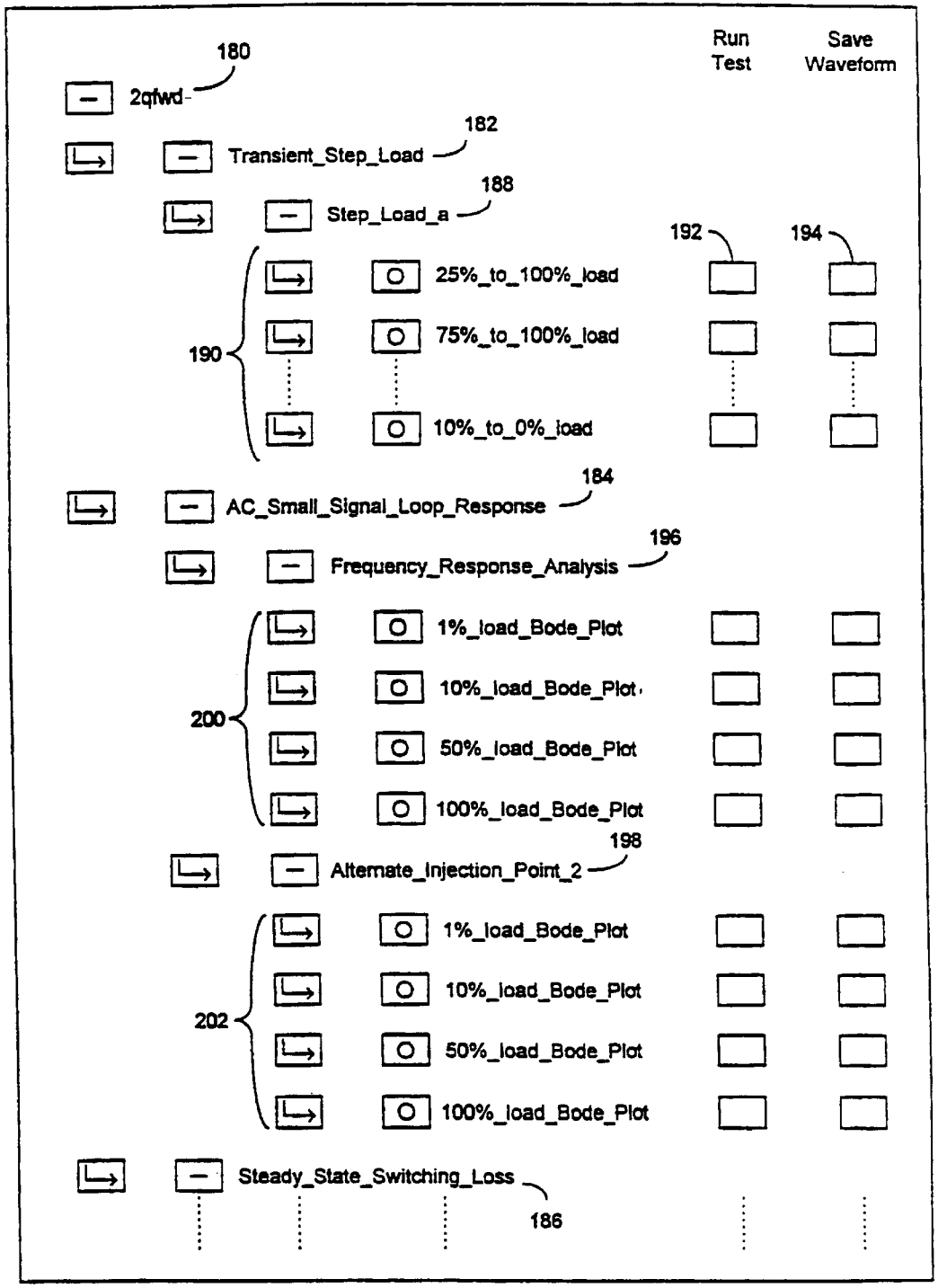

FIG. 10 is a menu of test-type objectives and corresponding sets of simulation tests from which the designer selects the simulation tests to be performed. Thus, for the two transistor forward power stage subsystem 150 illustrated in FIG. 8, the menu of FIG. 10 identifies each subsystem at 180, as well as a series of test-type objectives 182, 184, and 186 to be employed. More particularly, in the case of the two transistor forward subsystem identified at 180, the test-type objectives include a transient step load 182, an AC small signal loop response 184, steady state switching loss 186, and so forth. Test-type objective 182 has only one test table, "Step Load a" 188, in which tests 190 (three of which indicated in FIG. 10) are employed. The user selects one or more tests from table 188 by checking the appropriate block 192 (e.g., stepping from 25% to 100% of load, stepping from 75% to 100% of load, and continuing to stepping from 10% to 0% of load). Optionally, the designer may also save the waveforms generated for any given test by selecting the appropriate block 194. Similarly, test type objective 184 employs two tests tables, a frequency response analysis test table 196 and an alternate injection point two test table 198, each of which having a collection of tests 200 or 202 for selection by the designer, again by checking the appropriate block 192 or 194.

In the use of the invention to design circuits, the user may not initially check blocks 194 to save the waveforms, primarily because the waveform data require large memory requirements and a considerable amount of time to process and save. Instead, the user will run initial tests and either adjust the parameters through the prompts of menu of FIG. 9A or operate an optional subroutine that will automatically adjust those parameters based on different devices from the database 63 (FIGS. 5 and 6A). Thus, based on the report generated at step 104 (FIG. 6B), the processor may be programmed to select different devices and adjust the parameters provided to system deck 74.

One optional and desirable feature of the present invention resides in the provision of storing manufacturing tolerances and specifications within the device database 63 and the application of those tolerances to the parameters of data represented by the inputs at FIG. 9A to develop a "best case" and "worst case" manufacturing likelihood of the completed circuit. The designer could invoke the operation of such an optional feature after the circuit design has been optimized to nominal conditions, and the simulation tests are performed employing deviations of the mathematical models of the devices of the club reflecting the manufacturing tolerances. Thus, application of the manufacturing tolerances, and recording of the waveforms may be most effectively employed at a later iteration of the circuit design, not at an initial iteration.

Another optional and desirable feature includes performance of audits to compare a test result with expected test results or specifications, or to known design errors. Thus, the invention permits checking manufactured circuits to ensure compliance with pre-established design specifications and test performances, as well as making certain that known design errors are not present in the circuit. Known design errors might, for example, be the result of design deficiencies or defective materials (e.g., wrong semiconductor materials) employed in the design or manufacture of the circuit that can be identified by the execution of simulation tests of the present invention.

With the present invention, the design and simulation of a system such as system 10 or subsystem 150, may be divided into manageable subsystems capable of being individually simulated using commercially available simulation engines, such as Simplis® simulation engine 65. Simulation is performed on smaller functional circuits to the extent possible to verify satisfactory stand-alone performance. After the smaller functional circuits are identified as performing as desired in a stand-alone mode, the smaller functional circuits are combined into the larger functional circuits for additional subsystem level simulation testing.

Most important, simulation of each subsystem is optimized, based on the test objectives of the selected test-type objective. Hence, matching test-type objectives to only the necessary portions of the subsystem and elimination of superfluous electrical actions effectively reduce the simulation processing and time. Hence, while the mathematical model of an output capacitor might take one form for one test, it may take another form for another test. Thus, as explained above in reference to FIGS. 3 and 4, an output capacitor is modeled for a switching loss test as shown at model level II in FIG. 3, whereas it is modeled for an output ripple test as shown at model level III in FIG. 3.

Optimization of the simulation is also achieved by tailoring the modeling of critical components to the test-type objectives so that the simplest meaningful level of model (simplest equivalent circuit) is used for each critical component for a given test-type objective. While the complexity of the model may be different for different test-type objectives, it is not necessary to employ the most complex model of a component for all test-type objectives. By providing plural mathematical device models of critical components and selecting the simplest model level consistent with achieving the desired level of accuracy for the given test-type objective, simulation processing time is minimized. The matrix of FIG. 4 provides an example of how a proper mathematical model is selected for a given test-type objective to optimize the simulation process. The matrix predefines the implementation details of individual tests or sets of tests to achieve a given test type objective. The mathematical device models, the test-type objectives, and the simulation objective matrix may be standardized, making the process transportable between users to enable consistent test results to be achieved regardless of the skill level of the user.

Moreover, the invention permits modification of custom test database 90 (FIG. 6A) to add tests and test-type objectives and define and re-define subsystems and clubs to tailor the system and process to the specific requirements of the user. User modification of the test options 110 (FIG. 6B) permits versatility of the system to alter tests and circuit specifications by altering load and source data.

The capability to apply pre-engineered simulation tests to one member of a broad class of similar systems is provided in the invention by encoding simulation test information in a novel normalized format. Pre-engineered tests are organized by simulation objective. For a given simulation objective, individual tests may be further grouped together for organizational purposes. In the example shown below, individual tests are grouped together into test tables.

Test type (simulation objective)
        Test table_1
        Test table_2
            Test_1
            Test_2
            . . .

Each test is defined in the context of a specific simulation test objective or test type. For each simulation objective or test type, there are an assumed corresponding preferred deck extraction strategy and preferred model level selection strategy. For a given simulation objective or test type, individual tests are grouped together in one or more test tables. Within a test table, each individual test is made up of four parts, which include test name, initial conditions, test conditions, and test measurements.

The "test name" is unique among the tests in a given test table.

The "initial conditions" define the state of operation of each of the system components for which specifying an initial condition would be appropriate (e.g., energy storage devices and switching devices) at the beginning of the simulation test.

The "test conditions" are defined in a novel normalized format such that the external components providing functions such as input voltages, output loads, and excitation signals are specified in terms that can be applied to any member of a broad class of similar systems. Based on these test conditions, and in a manner described below, the appropriate sources, loads, and other external components are added to the test-type deck to form a simulation deck that is submitted to the simulation engine to execute the specified test.

The "test measurements" describe the waveforms that are captured and analyzed to make the desired assessment of the system behavior. Again, by encoding this information in a novel normalized format, the invention enables a user to apply a pre-defined test to a unique test-type deck in a manner that pre-defines what specific waveforms must be analyzed, what analysis must be done on each waveform, and what the acceptable range of results is when compared to the unique system specifications.

Preparatory to addressing how each of the four parts of an individual pre-engineered test can be accomplished, the description below addresses the novel normalized format that is used to facilitate automating the inclusion of the external components into the simulation deck and to facilitate automating creation of output waveform statements used by the simulator to assess the targeted performance parameters. Fundamentally, pre-engineered tests implement a method in which a test can be defined in generic terms but can be applied specifically to a unique system. This can be accomplished by having the user provide mapping information between the generic terms and the corresponding unique system attributes. In this invention, we define four vehicles for performing this mapping function; they include generic node names, club names, generic signal names, and generic specification names.

The pre-engineered tests are defined using generic circuit node names or more simply "generic node names." The user provides for each unique system a mapping between the generic node names used in the pre-engineered tests and the unique node names of the particular system netlist being tested with simulation. An example of such mapping would be:

| generic node name | unique system node name |
| --- | --- |
| vout+ | +5V |
| vout− | 5Vreturn |

-continued

| generic node name | unique system node name |
|---|---|
| vin+ | GND |
| vin− | −48V |

For situations in which particular devices are identified by reference designator, clubs in the pre-engineered tests are used to indicate the generic class of devices upon which a user operates. For example, if a user needs to identify the output inductors by reference designator so that the user can look at the current flowing through them, the user will define an attribute club that lists all of the output inductors in the system. In the following example, there is only one output inductor L1 but two output capacitors C1 and C2 in the entire system.

| club name | devices belonging to club |
|---|---|
| output_inductors | L1 |
| output_capacitors | C1, C2 |

A "generic signal name" can be defined either as the voltage between two generic node names or as the current through a generic class of devices. The shorthand notation used for this is:

generic_signal_name=$V$(first_node, second_node), where the V( ) operator is used to indicate the voltage between the pair of nodes (first_node, second_node), or generic_signal_name=$I$(club_name), where the I( ) operator is used to indicate the current through a particular device.

A "generic specification name" is mapped to a specific numerical value of a particular performance specification of a unique system or subsystem. The shorthand notation used for this is:

generic_specification_name=specification_value, where specification_value represents the numerical value of the corresponding specification for the particular unique system or subsystem. An example could be:

$V$input_max=60

$V$out_max=5.5

$V$out_min=4.5.

Having defined the four mapping vehicles used to facilitate the translation of generically defined per-engineered simulations tests into the specific simulation tests for a given unique system or subsystem, a user applies these tools, as illustrated by several examples presented below. Keeping in mind the examples above, a user could define two generic signal names Vout and Vin as $V$out=$V$(out+,out−)

$V$in=$V$(in+,in−), where, for example, Vout would represent the voltage between the two generic node names "out+" and "out−".

Depending on a user's purpose, the user can interpret this information in two slightly different ways. In the test measurement portion of the simulation test definition, generic signal names are interpreted as requests to have the simulation engine output the particular waveform defined by the generic signal name. For example, in the node mapping given above, the generic signal name Vout would be interpreted as a request to have the simulation engine produce a waveform corresponding to the voltage between the nodes (+5V, 5Vreturn) or V(+5V, 5Vreturn) in the unique system. Similarly, Vin would be interpreted as a request to produce a waveform corresponding to the voltage V(GND, −48V) in the unique system.

By contrast, in the test condition portion of the test definition, generic signal names are interpreted as requests to insert the appropriate external component(s) into the simulation deck. For example, the statement $V$in=60 would be interpreted as a request to insert a statement into the simulation deck that would attach a voltage source of 60 volts between nodes (GND, −48V).

In a final example of generic signal names, a generic signal name could be defined as IX=$I$(output_inductors).

In the test measurement portion of the test definition, this signal name would be interpreted as a request to have the simulation engine produce the current waveforms of all of the devices in the output_inductors club. In the example above, this would be interpreted as a request to produce I(L1), i.e., the current waveform through L1. On the other hand, the expression I(output_capacitors) would be interpreted to mean the current through C1 or I(C1) and the current through C2 or I(C2). In this way we have defined a generic signal name in such a way as it can be applied to many different unique systems by simply providing unique mapping of the members of the output_capacitors club. The final mapping vehicle, generic specification names, is used to show the relationship between generic specification names and specific specification values of a unique system or subsystem. "Generic specification names" can be used to define the acceptable range of expected values for the analysis results performed on waveshapes defined by generic signal names.

The description set forth above defining the four vehicles for mapping between the generic terms and the corresponding unique system attributes, generic node names, club names, and generic signal names provides the background for a description of how a user can accomplish the four main parts of a simulation test: test name, initial conditions, test conditions, and test measurements.

A unique test name is given to each pre-engineered test within the same test table. This is done so that the user can request any one of the tests of a given test table.

The initial conditions for a given test may be defined specifically for that test or, by referencing a previous test name, they can be defined as the final conditions of a previously executed test.

Pre-engineered test conditions can be created by adding external components using the four mapping vehicles described above. A user can define a set of operators, such as V(node1, node2), I(node1, node2), and R(node1, node2), that are interpreted in the test condition portion of the test definition as a request to place a particular external component, such as a voltage source, a current source, or a resistor, from node1 to node2 in the simulation deck. For example, if a user defined the following generic signal name Iload as $I$load=$I$(out+, out−), then the statement $I$load=30 in the test condition portion of the simulation test definition would be interpreted as a request to place a current source of 30A from node +5V to node 5Vreturn. Similarly, a generic signal name Rload defined as $R$load=$R$(out+,out−)

with a statement $R$load=0.083 in the test condition portion of the simulation test definition would be interpreted as a request to place a resistor of 0.083 Ohm from node +5V to node 5Vreturn into the simulation deck for this particular test.

Pre-engineered test measurements are also defined using the four mapping vehicles described above. In the test measurement portion of the test definition, generic signal names are interpreted as requests for the simulation engine to produce the voltage, current, or other electrical waveform defined in comparable manner to the examples above.

In addition to requesting the needed output waveforms from the simulation engine, the test measurement portion of the test definition can be configured to request a pre-defined analysis of any of the requested output waveforms and, if desired, to compare the results of this analysis with the appropriate specific specifications of the unique system or subsystem. For example, instead of defining the input voltage Vin as $V$in=60, a user can use the much more generic definition of $V$in=$V$input_max, where the generic specification name Vinput_max is defined as $V$input_max=60.

This approach allows the user to make the test definition far more generic and hence applicable to a much broader class of similar systems. When it appears in the test condition portion of the simulation test definition, the statement Vin=Vinput_max is interpreted as a request to place a 60V source from node GND to −48V.

When generic specification names are used in the output measurement portion of the simulation test definition, they are often used in conjunction with results analysis operators. Results analysis operators such as MAX, MIN, RMS, AVG can be defined in the following fashion:

| Statement | Operator | Operand | Result |
|---|---|---|---|
| MIN (waveform) | MIN | waveform | minimum value in waveform |
| MAX (waveform) | MAX | waveform | maximum value in waveform |
| RMS (waveform) | RMS | waveform | RMS value of waveform |
| AVG (waveform) | AVG | waveform | average value of waveform |

When it appears in the output measurement portion of the simulation test definition, the statement MAX(Vout) <Voutput_max would be interpreted to first request that the simulation engine output the waveform for V(+5V, 5Vreturn). The MAX operator would be used to compute the maximum value of the V(+5V, 5Vreturn) waveform. That result would then be compared with the specific value of the generic specification name Voutput_max. In this case, the maximum value of V(+5V, 5Vreturn) would be compared with 5.5V. If this maximum value of V(+5V, 5Vreturn) was less than 5.5V, the results of this portion of the simulation test would be set to PASS. If the maximum value of V(+5V, 5Vreturn) exceeded 5.5V, the results of the simulation test would be set to FAIL. This analysis capability can be further extended to include more complex analysis, such as indicated by the output measurement statement MAX($V$out)−MIN($V$out)<$V$output_peak_to_peak, where Voutput_peak_to_peak is the generic specification for peak-to-peak output voltage.

The capability to apply pre-engineered simulation tests to one of a broad class of similar systems is provided in the invention by encoding the simulation test information in a novel normalized format described above. Using this method, it is possible for skilled users to create a set of pre-engineered simulation tests that may be readily applied by a much less experienced user. All that is needed is for the individual user to supply the mapping information that relates the information about the specific attributes of the unique system to the generic names used to define these pre-engineered tests. The time required to provide this mapping information is typically far less than that required to define a comparably comprehensive set of unique simulation tests for a particular system or subsystem.

Because these pre-engineered tests are organized by simulation objective, they may be coordinated and used in conjunction with a deck extraction strategy and a model selection strategy that serve the same simulation objective. This permits the full power of any one of deck extraction, model level selection, and pre-engineered test execution to be used in any combination with the other two of them.

While the present invention has been described in connection with the assignment of mathematical device models into "clubs" that share common electrical characteristics or functions, the clubs may include or describe properties other than electrical properties, and these properties may be associated with other than physical elements. For example, the clubs may comprise non-physical elements, such as software elements, code or signal properties, and may comprise non-electrical properties, such as magnetic forces, radiant energies, and mechanical properties.

Although the present invention has been described with reference to preferred embodiments, workers skilled in the art will recognize that changes may be made in form and detail without departing from the spirit and scope of the invention.

What is claimed is:

1. A method of simulating the electrical performance of an electronic circuit that includes one or more analog circuit devices and is represented by a netlist, the netlist specifying circuit components of which the electronic circuit is composed and their points of interconnection, comprising:

formulating a simulation objective for simulating predetermined electrical performance parameters of the electronic circuit;

executing in a manner consistent with the simulation objective a streamlined simulation of the electronic circuit by carrying out one or more of:

performing a deck extraction process to form a test-type deck circuit, the deck extraction process including identifying and excluding from the test-type deck circuit a first set circuit components of the electronic circuit that are unessential to its operation in the streamlined simulation of the electronic circuit;

performing a device modeling strategy to select, for each member of a second set of circuit components of the electronic circuit, a device model level representing a level of simulation complexity that is consistent with the simulation objective; or performing a predefined simulation test to the electronic circuit, the predefined simulation test including simulation test information encoded in a normalized format that uses at least one of generic node names, club names, generic signal names, or generic specification names to enable application to a unique electronic circuit a definition of the predefined simulation test in the normalized format.

2. The method of claim 1, in which the performing of a pre-engineered simulation test of the electronic circuit further comprises applying to the electronic circuit one or more simulated external components to form a simulation deck circuit on which to assess the predetermined electrical performance parameters.

3. The method of claim 1, in which the performing of a pre-engineered simulation test of the electronic circuit further comprises performing a predefined simulation test of the electronic circuit for which the members of the second set of circuit components each have a device model level representing a level of simulation complexity consistent with the pre-engineered simulation objective, the pre-engineered simulation test applying to the electronic circuit one or more simulated external components to form a simulation deck circuit on which to assess the predetermined electrical performance parameters.

4. The method of claim 1, in which the performing of a pre-engineered simulation test of the electronic circuit further comprises including simulation control statements in a simulation deck to identify test measurements for assessing predetermined electrical performance parameters.

5. The method of claim 4, in which the pre-engineered simulation test designates circuit waveforms and a manner in which they are to be analyzed, and further comprising comparing with pre-established design specifications and performance requirements analysis results obtained by the pre-engineered simulation test.

6. The method of claim 5 further comprising reporting to the user the analysis results and results of the comparison.

7. The method of claim 1, in which the performing of a deck extraction process to form a test-type deck includes:
  identifying a test-type objective to be performed;
  selecting function clubs and attribute clubs based on the identified test-type objective;
  extracting from the netlist a test-type deck circuit based on an inclusion or exclusion of each of the selected function clubs; and
  identifying preferred device model levels for inclusion in the test-deck circuit for each of the selected attribute clubs.

8. The method of claim 7, in which the analog circuit devices are members of one or more clubs selected from a group comprising attribute clubs and function clubs.

9. The method of claim 8, in which the extraction of the test-type deck circuit further comprises identifying first function clubs required for the identified test-type objective, identifying second function clubs that are included in the first function clubs but are superfluous to the identified test-type objective, and extracting from the test-type deck circuit portions based on the first function clubs to the exclusion of the second function clubs.

10. The method of claim 8, in which the inclusion of device models in the test-type deck circuit is performed by identifying attribute clubs used for the identified test type objective, selecting for the analog circuit devices of the identified attribute clubs a model level based on the selected test-type objective, and including a device model in the test-type deck circuit for each analog circuit device of the identified attribute clubs corresponding to the selected model level.

11. The method of claim 1, in which the performing of a device modeling strategy further comprises:
  providing a database containing a matrix of test-type objectives, attribute clubs, and device model levels;
  selecting a test-type objective for a simulation test to be performed;
  selecting for each analog circuit device a device model based on the model level associated by the matrix with the selected test-type objective; and
  executing a simulation test corresponding to the selected test-type objective using the selected device model.

12. The method of claim 11, in which the matrix correlates test-type objectives with the simplest device model used for the respective analog circuit device for execution of the simulation test corresponding to the associated test-type objective.

13. The method of claim 11, in which multiple test-type objectives are to be performed for the electronic circuit, and further comprising iteratively selecting successive test-type objectives from the database and, for each iteration, selecting device models based on the model level associated with the selected test-type objective.

14. Computer apparatus for simulating the electrical performance of an electronic circuit that includes one or more analog circuit devices and is represented by a netlist, the netlist specifying circuit components of which the electronic circuit is composed and their points of interconnection, comprising:
  an input device for receiving a netlist representing an electronic circuit;
  a processor for executing in a manner consistent with a simulation objective a streamlined simulation of predetermined electrical performance parameters of the electronic circuit by carrying out one or more of:
  a deck extraction process to form a test-type deck circuit, the deck extraction process including identifying and excluding from the test-type deck circuit a first set circuit components of the electronic circuit that are unessential to its operation in the streamlined simulation of the electronic circuit;
  a device modeling strategy that selects, for each member of a second set of circuit components of the electronic circuit, a device model level representing a level of simulation complexity that is consistent with the simulation objective; or
  a pre-engineered simulation test to the electronic circuit, the predefined simulation test including simulation test information encoded in a normalized format that uses at least one of generic node names, clubs, generic signal names, or generic specification names to enable application to a unique electronic circuit a definition of the predefined simulation test in the normalized format.

15. The computer apparatus of claim 14, in which the pre-engineered simulation test of the electronic circuit further comprises application to the electronic circuit one or more simulated external components to form a simulation deck circuit on which to assess the predetermined electrical performance parameters.

16. The computer apparatus of claim 14, in which the pre-engineered simulation test of the electronic circuit further comprises a predefined simulation test for which the members of the second set of circuit components each have a device model level representing a level of simulation complexity consistent with the pre-engineered simulation objective, the pre-engineered simulation test applying to the electronic circuit one or more simulated external components to form a simulation deck circuit on which to assess the predetermined electrical performance parameters.

17. The computer apparatus of claim 14, in which the pre-engineered simulation test of the electronic circuit further comprises a predefined simulation test of a test-type deck circuit where simulation control statements are generated and included in a simulation deck for purposes of identifying test measurements needed to assess predetermined electrical performance parameters.

18. The computer apparatus of claim 14, in which the deck extraction process carried out by the processor to form a test-type deck includes:

identification of a test-type objective to be performed;

selection of function clubs and attribute clubs based on the identified test-type objective;

extraction from the netlist a test-type deck circuit based on an inclusion or exclusion of each of the selected function clubs; and identification of preferred device model levels for inclusion in the test-deck circuit for each of the selected attribute clubs.

19. The computer apparatus of claim 18, in which the analog circuit devices are members of one or more clubs selected from a group comprising attribute clubs and function clubs.

20. The computer apparatus of claim 14, in which the processor further comprises a database containing a matrix of test-type objectives, attribute clubs, and device model levels, and in which the device modeling strategy carried out by the processor further comprises:

selection of a test-type objective for a simulation test to be performed;

selection for each analog circuit device a device model based on the model level associated by the matrix with the selected test-type objective; and execution of a simulation test corresponding to the selected test-type objective using the selected device model.

21. The computer apparatus of claim 20, in which the matrix correlates test-type objectives with the simplest device model used for the respective analog circuit device for execution of the simulation test corresponding to the associated test-type objective.

22. The computer apparatus of claim 20, in which multiple test-type objectives are to be performed for the electronic circuit, and further comprising iteratively selecting successive test-type objectives from the database and, for each iteration, selecting device models based on the model level associated with the selected test-type objective.

* * * * *